US012641805B2

(12) United States Patent
Wu et al.

(10) Patent No.: US 12,641,805 B2
(45) Date of Patent: May 26, 2026

(54) SEMICONDUCTOR STRUCTURE AND METHOD FOR FORMING SAME

(71) Applicant: Semiconductor Manufacturing International (Shanghai) Corporation, Shanghai (CN)

(72) Inventors: Yichao Wu, Shanghai (CN); Jisong Jin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 460 days.

(21) Appl. No.: 18/203,816

(22) Filed: May 31, 2023

(65) Prior Publication Data

US 2024/0313042 A1    Sep. 19, 2024

(30) Foreign Application Priority Data

Mar. 14, 2023    (CN) ........................ 202310246344.X

(51) Int. Cl.
H10D 1/68      (2025.01)
H10D 1/00      (2025.01)
(Continued)

(52) U.S. Cl.
CPC ............. H10D 1/696 (2025.01); H10D 1/043 (2025.01); H10D 1/60 (2025.01); H10D 1/692 (2025.01);
(Continued)

(58) Field of Classification Search
CPC .............. H01L 23/642; H01L 23/5222; H01L 23/5223; H10D 1/714; H10D 1/692;
(Continued)

(56) References Cited

U.S. PATENT DOCUMENTS 8,039,354 B2 * 10/2011 Chinthakindi ...... H01L 23/5228
                                                  257/E21.019
10,692,967 B1 * 6/2020 Chen ...................... H10D 1/714
(Continued)

FOREIGN PATENT DOCUMENTS

CN         113571637 B   *   2/2022           H10D 1/692

OTHER PUBLICATIONS

CN-113571637-B-Machine English Translation (Year: 2025).*

*Primary Examiner* — Jose R Diaz

(74) *Attorney, Agent, or Firm* — Crowell & Moring LLP

(57) ABSTRACT

A semiconductor structure includes: a base, a first and a second electrode layer, where the first electrode layer is located on the base and includes a first comb handle part and a plurality of first comb tooth parts connected to the first comb handle part and arranged in parallel, one end of the first comb handle part is configured to access an input signal, and the other end is configured to access an output signal; and the second electrode layer is located on the base and located on the same layer with the first electrode layer, and includes a second comb handle part and a plurality of second comb tooth parts connected to the second comb handle part and arranged in parallel, the second comb tooth parts and the first comb tooth parts are parallel in a crossed manner, and the second comb handle part is configured to be grounded.

20 Claims, 6 Drawing Sheets

(51) Int. Cl.

| | | |
|---|---|---|
| *H10D 1/60* | (2025.01) | |
| *H10D 84/00* | (2025.01) | |
| *H10D 89/10* | (2025.01) | |
| *H10W 20/41* | (2026.01) | |
| *H10W 20/42* | (2026.01) | |

(52) U.S. Cl.
CPC ............. *H10D 1/714* (2025.01); *H10D 1/716* (2025.01); *H10D 84/212* (2025.01); *H10D 89/10* (2025.01); *H10W 20/42* (2026.01); *H10W 20/435* (2026.01)

(58) Field of Classification Search
CPC .. H10D 1/68; H10D 1/42; H10D 1/43; H10D 1/60; H10D 84/212; H10D 89/10; H10D 1/696; H10D 1/043; H10D 1/716; H01G 4/005; H01G 4/228
See application file for complete search history.

(56) References Cited

U.S. PATENT DOCUMENTS

| 2003/0183864 A1* | 10/2003 | Miyazawa | ........... | H10D 84/212 |
| | | | | 257/532 |
| 2013/0228894 A1* | 9/2013 | Yen | ........................ | H10D 1/043 |
| | | | | 257/532 |

* cited by examiner

SEMICONDUCTOR STRUCTURE AND METHOD FOR FORMING SAME

RELATED APPLICATION

The present application claims priority to Chinese Patent Application No. 202310246344.X, filed on Mar. 14, 2023, the entire content of which is incorporated herein by reference.

TECHNICAL FIELD

Embodiments and implementations of the present disclosure relate to the field of semiconductor manufacturing, and more particularly relate to a semiconductor structure and a method for forming the same.

BACKGROUND

A metal-oxide-metal (MOM) capacitor is a quite key element in many mixed signal radio frequency integrated circuits (RFIC), such as an analog frequency tuned circuit, switched capacitor circuits, a filter, a resonator, up-conversion and down-conversion mixers, analog/digital converters (A/D Converters), etc., which plays an inter-matching role and can greatly optimize the performance of the RFIC.

It is desirable to improve a performance of the metal-oxide-metal (MOM) capacitor structure.

SUMMARY

In order to address the above problems, embodiments and implementations of the present disclosure provide a semiconductor structure and a method for forming the same, thereby improving a high-frequency filter function of a capacitor, and then improving the work performance of the semiconductor structure.

In order to address the above problems, the present disclosure provides a semiconductor structure. In one form, a semiconductor structure includes: a base, a first electrode layer and a second electrode layer, where the first electrode layer is located on the base and includes a first comb handle part and a plurality of first comb tooth parts connected to the first comb handle part and arranged in parallel, one end of the first comb handle part is configured to access an input signal, and the other end of the first comb handle is configured to access an output signal; and the second electrode layer is located on the base and located on the same layer with the first electrode layer, and includes a second comb handle part and a plurality of second comb tooth parts connected to the second comb handle part and arranged in parallel, the second comb tooth parts and the first comb tooth parts are parallel in a crossed manner, and the second comb handle part is configured to be grounded.

In some implementations, two sides of the first comb handle part are both provided with the plurality of first comb tooth parts connected therewith; and the second electrode layer is located on the two sides of the first comb handle part, and the second comb tooth parts on the second electrode layer on each side and the first comb tooth parts on the same side are parallel in the crossed manner.

In some implementations, the semiconductor structure further includes: a dielectric layer located on the base, the dielectric layer includes a first dielectric layer and a second dielectric layer located at a top of the first dielectric layer, and the second dielectric layer and the first dielectric layer have etching selection ratio; and both the first electrode layer and the second electrode layer are located in the second dielectric layer, and are located on a top surface of the first dielectric layer.

In some implementations, a pitch between the adjacent first comb tooth parts and second comb tooth parts is 10 nm to 30 nm in the arrangement direction of the first comb tooth parts.

In some implementations, in the arrangement direction of the second comb tooth parts, a width of the second comb tooth part located on an outermost side is greater than or equal to widths of the rest of second comb tooth parts.

In some implementations, the semiconductor structure further includes: a first via interconnect structure located on a top of the first comb handle part and electrically connected to the first comb handle part, where the first via interconnect structure includes a first sub via interconnect structure and a second sub via interconnect structure which are located at two ends of the first comb handle part respectively, the first sub via interconnect structure is configured to access the input signal, and the second sub via interconnect structure is configured to access the output signal; and a second via interconnect structure located on a top of the second comb handle part, electrically connected to the second comb handle part and configured to be grounded.

In some implementations, the first electrode layer and the second electrode layer are the same in material.

In some implementations, the material of the first electrode layer includes one or more of aluminum, copper, titanium nitride, cobalt and tantalum nitride; and the material of the second electrode layer includes one or more of aluminum, copper, titanium nitride, cobalt and tantalum nitride.

The present disclosure further provides a method for forming a semiconductor structure. In one form, a method includes: providing a base including a capacitance region; forming a first electrode layer on the base in the capacitance region, where the first electrode layer includes a first comb handle part and a plurality of first comb tooth parts connected to the first comb handle part and arranged in parallel, one end of the first comb handle part is configured to access an input signal, and the other end of the first comb handle is configured to access an output signal; and forming a second electrode layer on the base in the capacitance region, where the second electrode layer is located on the same layer with the first electrode layer and includes a second comb handle part and a plurality of second comb tooth parts connected to the second comb handle part and arranged in parallel, the second comb tooth parts and the first comb tooth parts are parallel in a crossed manner, and the second comb handle part is configured to be grounded.

In some implementations, in the step of forming the first electrode layer, two sides of the first comb handle part are both provided with the plurality of first comb tooth parts connected therewith; and in the step of forming the second electrode layer, the second electrode layer is located on the two sides of the first comb handle part, and the second comb tooth parts on the second electrode layer on each side and the first comb tooth parts on the same side are parallel in the crossed manner.

In some implementations, in the step of providing a base, the dielectric layer is formed on the base, and includes the first dielectric layer and the second dielectric layer located at the top of the first dielectric layer, and the second dielectric layer and the first dielectric layer have the etching selection ratio; in the step of forming a first electrode layer on the base, the first electrode layer located on a top surface of the first dielectric layer is formed in the second dielectric layer;

and in the step of forming a second electrode layer on the base, the second electrode layer located on the top surface of the first dielectric layer is formed in the second dielectric layer.

In some implementations, in the step of providing a base, the dielectric layer is formed on the base. The step of forming a first electrode layer and a second electrode layer includes: forming a first electrode groove and a second electrode groove in the dielectric layer, where the first electrode groove includes a first comb handle groove and a plurality of first comb tooth grooves connected to the first comb handle groove and arranged in parallel, the second electrode groove includes a second comb handle groove and a plurality of second comb tooth grooves connected to the second comb handle groove and arranged in parallel, and the second comb tooth grooves and the first comb tooth grooves are parallel in a crossed manner; and forming conductive materials in the first electrode groove and the second electrode groove, where the conductive materials located in the first electrode groove are used as a first electrode, including the first comb handle part located in the first comb handle groove and the first comb tooth parts located in the first comb tooth grooves, and the conductive materials located in the second electrode groove are used as a second electrode, including the second comb handle part located in the second comb handle groove and the second comb tooth parts located in the second comb tooth grooves.

In some implementations, in the step of providing a base, a pattern transfer layer is further formed on the top of the dielectric layer, and in a direction parallel to a surface of the pattern transfer layer, the pattern transfer layer includes the capacitance region; and the step of forming a first electrode groove and a second electrode groove includes: forming a plurality of first comb tooth mask openings located in the pattern transfer layer at intervals in parallel in the capacitance region; forming a first comb handle mask opening penetrating through the capacitance region in the pattern transfer layer, where the first comb handle mask opening communicates with the plurality of first comb tooth mask openings; forming a mask spacer layer on a side wall of the first comb handle mask opening and side walls of the first comb tooth mask openings; after the mask spacer layer is formed, removing the remaining pattern transfer layer in the capacitance region so as to form a plurality of second comb tooth mask openings which are arranged at intervals in parallel and are parallel to the first comb tooth mask openings in a crossed manner and a second comb handle mask opening which is in located in the side, away from the first comb handle mask opening, of the first comb tooth mask openings and communicates with the second comb tooth mask openings, where the second comb tooth mask openings and the second comb handle mask opening are spaced from the first comb tooth mask openings through the mask spacer layer; and with the mask spacer layer and the remaining pattern transfer layer as a mask, performing patterning treatment on the dielectric layer along the first comb handle mask opening, the first comb tooth mask openings, the second comb handle mask opening and the second comb tooth mask openings, and forming the first electrode groove and the second electrode groove in the dielectric layer.

In some implementations, after the plurality of first comb tooth mask openings located in the pattern transfer layer at intervals in parallel are formed in the capacitance region, the first comb handle mask opening penetrating through the plurality of first comb tooth mask openings is formed in the pattern transfer layer.

In some implementations, the material of the pattern transfer layer includes amorphous silicon.

In some implementations, before the plurality of first comb tooth mask openings located in the pattern transfer layer at intervals in parallel are formed in the capacitance region of the pattern transfer layer, the method further includes: performing doping treatment on the pattern transfer layer in the capacitance region to make the pattern transfer layer in the capacitance region and the pattern transfer layer on an outer side of the capacitance region have the etching selection ratio; and the step of removing the remaining pattern transfer layer in the capacitance region includes: removing the remaining pattern transfer layer in the capacitance region by utilizing etching selection ratio between a sacrificial layer in the capacitance region and a sacrificial layer on the outer side of the capacitance region.

In some implementations, the process for removing the remaining pattern transfer layer in the capacitance region includes a wet etch process.

In some implementations, the etching selection ratio between the pattern transfer layer in the capacitance region and the pattern transfer layer on the outer side of the capacitance region is greater than 120:1.

In some implementations, ions for performing the doping treatment on the pattern transfer layer in the capacitance region include one or more of C, B and P.

In some implementations, after the first electrode layer and the second electrode layer are formed, The method for forming a semiconductor structure further includes: forming the first via interconnect structure at the top of the first comb handle part, where the first via interconnect structure is electrically connected to the first comb handle part and includes the first sub via interconnect structure and the second sub via interconnect structure located at the two ends of the first comb handle part respectively, the first sub via interconnect structure is configured to access the input signal, and the second sub via interconnect structure is configured to access the output signal; and forming the second via interconnect structure at the top of the second comb handle part, where the second via interconnect structure is electrically connected to the second comb handle part and configured to be grounded.

Compared with the prior art, the technical solutions of embodiments and implementations of the present disclosure have at least the following advantages:

In forms of a semiconductor structure provided by this implementation of the present disclosure, the first electrode layer includes the first comb handle part and the plurality of first comb tooth parts connected to the first comb handle part, one end of the first comb handle part is configured to access the input signal, the other end is configured to access the output signal, the second electrode layer includes the second comb handle part and the plurality of second comb tooth parts connected to the second comb handle part, the second comb tooth parts and the first comb tooth parts are parallel in the crossed manner, and the second comb handle part is configured to be grounded.

In this implementation of the present disclosure, the first comb tooth parts and the second comb tooth parts form a capacitor, one end of the first comb handle part is configured to access signal input, the other end is configured to access signal output, the first comb tooth parts serve as an electrode plate of the capacitor, and meanwhile, the first comb tooth parts are connected to a circuit, so that the first electrode layer and the second electrode layer form a three-terminal capacitor, accordingly, grounded inductance of the capacitor is reduced, thereby improving the high-frequency filter function of the capacitor. In addition, through an electric connection lead formed after one end of the first comb handle part accesses the input signal and the other end accesses the output signal, a current flows in from an Input and flows out from an Output and penetrates through the MOM capacitor. Accordingly, a T-type lowpass filter is formed by lead inductance, thereby improving the work performance of the semiconductor structure.

DETAILED DESCRIPTION

As discussed in the background, a work performance of a current semiconductor structure needs to be improved. A semiconductor structure is combined to analyze the reasons why the performance of the semiconductor structure is required to be improved.

Figure 1:
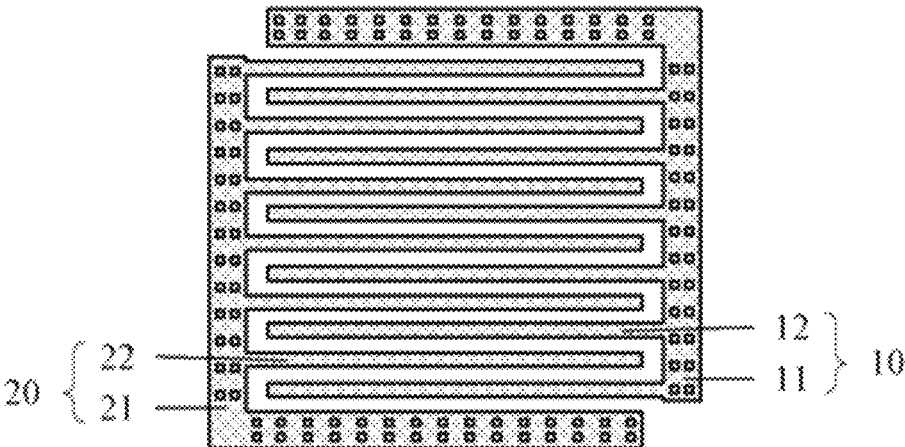
FIG. 1 is a schematic structural diagram of a semiconductor structure.

FIG. 1 is a schematic structural diagram of a semiconductor structure.

Referring to FIG. 1, the semiconductor structure includes: a first electrode layer 10 and a second electrode layer 20. The first electrode layer 10 includes a first comb handle part 11 and a plurality of first comb tooth parts 12 connected to the first comb handle part 11. The first comb handle part 11 is electrically connected to an external circuit so as to apply a potential to the first comb tooth parts 12. The second electrode layer 20 and the first electrode layer 10 are located on the same layer, the second electrode layer includes a second comb handle part 21 and a plurality of second comb tooth parts 22 connected to the second comb handle part 21, the second comb tooth parts 22 and the first comb tooth parts 12 are parallel in a crossed manner, and the second comb handle part 21 is electrically connected to the external circuit so as to apply a potential to the second comb tooth parts 22.

By research, an MOM capacitor is formed by the first comb tooth parts 12 of the first electrode layer 10 and the second comb tooth parts 22 of the second electrode layer 20, while it is difficult for the formed MOM capacitor to cope with high-frequency demands, and the high-frequency character of the MOM capacitor is hard to improve.

To address the technical problems described above, the present disclosure provides a semiconductor structure. In one form, a semiconductor structure includes: a base, a first electrode layer and a second electrode layer, where the first electrode layer is located on the base and includes a first comb handle part and a plurality of first comb tooth parts connected to the first comb handle part and arranged in parallel, one end of the first comb handle part is configured to access an input signal, and the other end is configured to access an output signal; and the second electrode layer is located on the base and located on the same layer with the first electrode layer, and includes a second comb handle part and a plurality of second comb tooth parts connected to the second comb handle part and arranged in parallel, the second comb tooth parts and the first comb tooth parts are parallel in a crossed manner, and the second comb handle part is configured to be grounded.

In the semiconductor structure provided by this implementation of the present disclosure, the first electrode layer includes the first comb handle part and the plurality of first comb tooth parts connected to the first comb handle part, one end of the first comb handle part is configured to access the input signal, the other end is configured to access the output signal, the second electrode layer includes the second comb handle part and the plurality of second comb tooth parts connected to the second comb handle part, the second comb tooth parts and the first comb tooth parts are parallel in the crossed manner, and the second comb handle part is configured to be grounded.

In this implementation of the present disclosure, the first comb tooth parts and the second comb tooth parts form a capacitor, one end of the first comb handle part is configured to access signal input, the other end is configured to access signal output, the first comb tooth parts serve as an electrode plate of the capacitor, and meanwhile, the first comb tooth parts are connected to a circuit, so that the first electrode layer and the second electrode layer form a three-terminal capacitor. Accordingly, grounded inductance of the capacitor is reduced, thereby improving a high-frequency filter function of the capacitor, and then improving the work performance of the semiconductor structure.

To make the above purposes, characteristics and advantages of this implementation of the present disclosure more apparent and easier to understand, specific embodiments and implementations of the present disclosure are described in detail below in combination with drawings.

Figure 2:
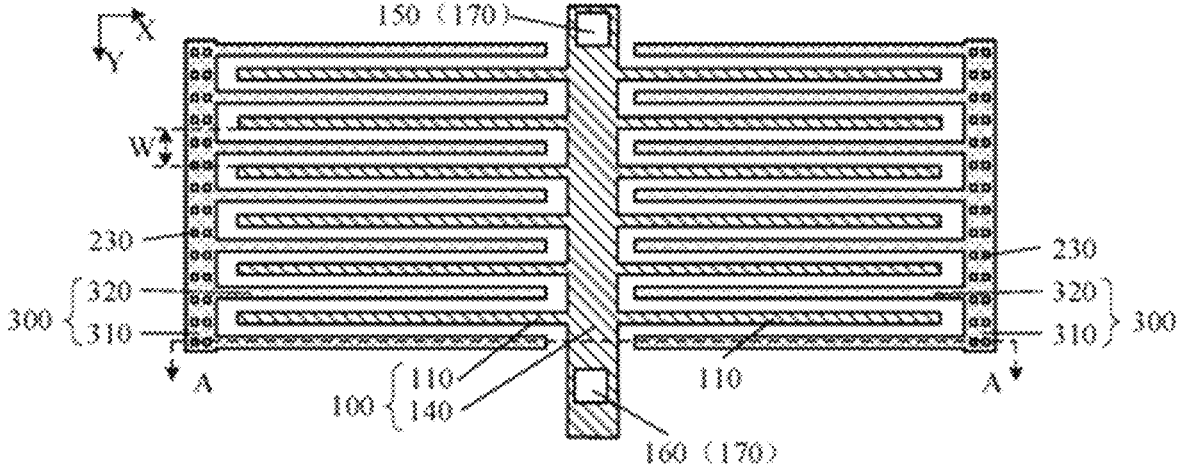
FIG. 2 to FIG. 3 are top views of one form a semiconductor structure.
Figure 3:
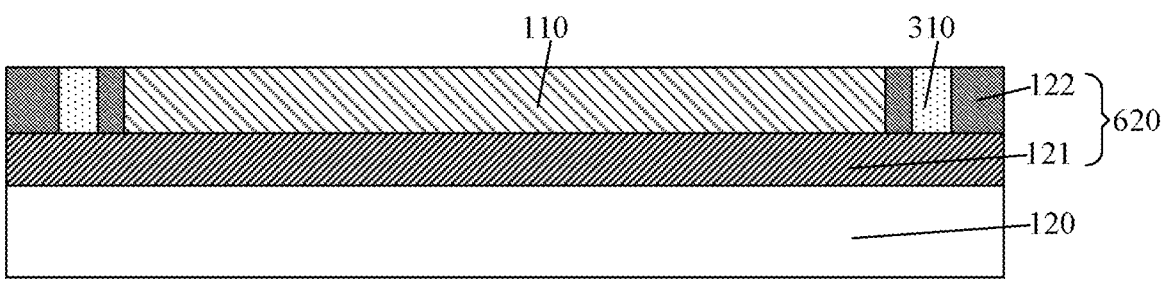
Figure 4:
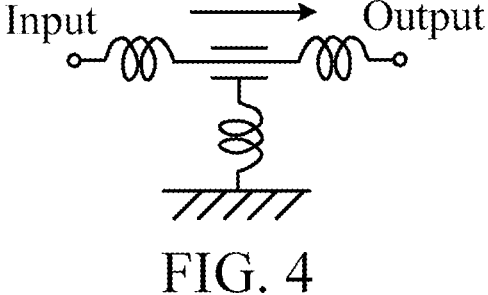
FIG. 4 is an equivalent circuit diagram of a capacitor according to one form of the present disclosure.

Referring to FIG. 2 to FIG. 4, FIG. 2 illustrates a top view of one form of a semiconductor structure, FIG. 3 is a section view of FIG. 2 in an AA direction, and FIG. 4 is an equivalent circuit diagram of a capacitor.

The semiconductor structure includes: a base 120, a first electrode layer 100 and a second electrode layer 300. The first electrode layer 100 is located on the base 120 and includes a first comb handle part 140 and a plurality of first comb tooth parts 110 connected to the first comb handle part 140 and arranged in parallel, one end of the first comb handle part 140 is configured to access an input signal, and the other end is configured to access an output signal. The second electrode layer 300 is located on the base 120, located on the same layer with the first electrode layer 100 and includes a second comb handle part 310 and a plurality of second comb tooth parts 320 connected to the second comb handle part 310 and arranged in parallel, the second comb tooth parts 320 and the first comb tooth parts 110 are parallel in a crossed manner, and the second comb handle part 310 is configured to be grounded.

In this implementation of the present disclosure, the first comb tooth parts 110 and the second comb tooth parts 320 form a capacitor, one end of the first comb handle part 140 is configured to access signal input, the other end is configured to access signal output, the first comb tooth parts 110 serve as an electrode plate of the capacitor, and meanwhile, the first comb tooth parts 110 are connected to a circuit, so that the first electrode layer 100 and the second electrode layer 300 form a three-terminal capacitor. Accordingly, grounded inductance of the capacitor is reduced, thereby improving a high-frequency filter function of the capacitor, and then improving the work performance of the semiconductor structure.

The base 120 is configured to provide a process platform for a process for forming a semiconductor structure.

In this implementation, the base 120 includes a substrate, and the substrate is a silicon substrate. In other implementations, the material of the substrate may alternatively be germanium, silicon germanide, silicon carbide, gallium arsenide or indium gallide or the like, and the substrate may alternatively be a silicon substrate on an insulator or a germanium substrate on the insulator or another type of substrate.

In this implementation, the semiconductor structure further includes: a dielectric layer 620 located on the base 120, and the dielectric layer 620 includes a first dielectric layer 121 and a second dielectric layer 122 located at a top of the first dielectric layer 121, and the second dielectric layer 122 and the first dielectric layer 121 have etching selection ratio.

The dielectric layer 620 provides a spatial position for arrangement of the first electrode layer 100 and the second electrode layer 300, and is further configured to isolate between the first electrode layer 100 and the second electrode layer 300.

In this implementation, the material of the dielectric layer 620 includes at least one of silicon oxide, silicon nitride, silicon oxynitride, silicon oxycarbide, silicon carbonitride or silicon oxy-carbonitride.

Specifically, in a process for forming the first electrode layer 100 and the second electrode layer 300, the second dielectric layer 122 and the first dielectric layer 121 have the etching selection ratio, and the first dielectric layer 121 can have a function of stopping etch, thereby reducing the phenomenon of over etching in the process of forming the first electrode layer 100 and the second electrode layer 300, and reducing the probability of damaging the base 120.

The second dielectric layer 122 provides a spatial position for arrangement of the first electrode layer 100 and the second electrode layer 300. Meanwhile, the second dielectric layer 122 is further configured to electrically isolate the first electrode layer 100 and the second electrode layer 300 formed later, and reduce the risk of electric leakage between the adjacent first electrode layer 100 and the second electrode layer 300.

In this implementation, the material of the first dielectric layer 121 includes one or more of silicon oxynitride, silicon oxycarbide, silicon carbonitride
and silicon oxy-carbonitride, and the material of the second dielectric layer 122 includes one or more of silicon oxide, silicon nitride and silicon oxynitride.

In this implementation, the first electrode layer 100 is used as an electrode plate of the MOM capacitor.

Specifically, the first comb tooth parts 110 in the first electrode layer 100 are used as the electrode plate of the MOM capacitor, and the first comb handle part 140 is connected to each first comb tooth part 110, so as to realize, through electric connection between the first comb handle part 140 and an external circuit structure, electric connection between the first comb tooth parts 110 and the external circuit structure.

In this implementation, one end of the first comb handle part 140 is configured to access the input signal, and the other end is configured to access the output signal.

One end of the first comb handle part 140 is configured to access the input signal, and the other end is configured to access the output signal, so that the plurality of first comb tooth parts 110 are connected to the circuit through the first comb handle part 140.

Accordingly, the plurality of first comb tooth parts 110 are also connected to the circuit when serving as the electrode plate of the MOM capacitor, thereby forming a three-terminal MOM capacitor. As shown in the circuit diagram of FIG. 4, through an electric connection lead formed after one end of the first comb handle part 140 accesses the input signal and the other end accesses the output signal, and a current flows in from an Input and flows out from an Output in an arrow direction and penetrates through the MOM capacitor. Accordingly, a T-type lowpass filter is formed by lead inductance.

In this implementation, two sides of the first comb handle part 140 are both provided with the plurality of first comb tooth parts 110 connected therewith.

Specifically, the two sides of the first comb handle part 140 are both provided with the plurality of first comb tooth parts 110 connected therewith, that is, the first comb tooth parts 110 on the two sides of the first comb handle part 140 share the first comb handle part 140, and the same first comb handle part 140 electrifies the first comb tooth parts 110 on the two sides thereof to form two MOM capacitors, thereby reducing an occupied area of the MOM capacitors, improving a space utilization rate of the MOM capacitors, and then improving an integration level of the semiconductor structure.

In this implementation, the first electrode layer 100 is located in the second dielectric layer 122, and the first electrode layer 100 is located on a top surface of the first dielectric layer 121.

It can be known from the foregoing that the dielectric layer 620 includes the first dielectric layer 121 and the second dielectric layer 122 located at the top of the first dielectric layer 121. In the process for forming the first electrode layer 100, the first dielectric layer 121 has the function of stopping etch, which reduces the probability of over etching of the base 120, and thus, a first electrode is formed in the second dielectric layer 122 and located on the top surface of the first dielectric layer 121.

It should be noted that in this implementation, the first comb handle part 140 in the first electrode layer 100 extends in a first direction (a Y direction in FIG. 2), the plurality of first comb tooth parts 110 in the first electrode layer 100 extend in a second direction (an X direction in FIG. 2) and are arranged in the first direction, and the first direction is perpendicular to the second direction.

In this implementation, the first electrode layer 100 is composed of a metal wire, that is, the first electrode layer 100 is made of a metal material.

In this implementation, the material of the first electrode layer 100 includes at least one of aluminum, copper, titanium nitride, cobalt or tantalum nitride.

Specifically, aluminum, copper, titanium nitride, cobalt and tantalum nitride have low specific resistance, so that a resistance value generated by the first electrode layer 100 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

In this implementation, the second electrode layer 300 is used as another electrode plate of the MOM capacitor.

Specifically, the second comb tooth parts 320 in the second electrode layer 300 are used as the electrode plate of the MOM capacitor, and the second comb handle part 310 is connected to each second comb tooth part 320, so as to realize, through electric connection between the second comb handle part 310 and the external circuit structure, electric connection between the second comb tooth parts 320 and the external circuit structure.

In this implementation, the second comb handle part 310 is configured to be grounded, and correspondingly, the second comb tooth parts 320 are grounded.

In this implementation, the second comb tooth parts 320 and the first comb tooth parts 110 are parallel in the crossed manner.

Specifically, there is a potential difference between the first electrode layer 100 and the second electrode layer 300, accordingly, there is the potential difference between the second comb tooth parts 320 and the first comb tooth parts 110, so that the second comb tooth parts 320 and the first comb tooth parts 110 are parallel in the crossed manner. The adjacent second comb tooth parts 320 and first comb tooth parts 110 and the second dielectric layer 122 between the second comb tooth parts 320 and the first comb tooth parts 110 form the metal-oxide-metal (MOM) capacitor.

In this implementation, the second electrode layer 300 is composed of a metal wire, that is, the second electrode layer 300 is made of a metal material.

Specifically, in this implementation, the material of the second electrode layer 300 includes at least one of aluminum, copper, titanium nitride, cobalt or tantalum nitride.

Specifically, aluminum, copper, titanium nitride, cobalt and tantalum nitride have low specific resistance, so that a resistance value generated by the second electrode layer 300 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

In this implementation, the second electrode layer 300 and the first electrode layer 100 are located on the same layer, that is, in the process for forming the first electrode layer 100 and the second electrode layer 300, the first electrode layer 100 and the second electrode layer 300 are formed in the same step, and thus, in this implementation, the first electrode layer 100 and the second electrode layer 300 are the same in material, which facilitates the technological process to be simplified, and improves the process efficiency.

It should be noted that that a pitch W between the adjacent first comb tooth parts 110 and second comb tooth parts 320 should not be too large or small in the arrangement direction of the first comb tooth parts 110. If the pitch W between the adjacent first comb tooth parts 110 and second comb tooth parts 320 is too large, capacitance of the MOM capacitor formed by the adjacent first comb tooth parts 110 and second comb tooth parts 320 is likely to be too low, the quantity of electric charge borne by the MOM capacitor is too small, and thus, it is difficult for the formed MOM capacitor to bring enough loads, which influences the work performance of the semiconductor structure. In addition, the too large pitch between the adjacent first comb tooth parts 110 and second comb tooth parts 320 is likely to cause the too large occupied area of the formed MOM capacitor, which does not facilitate development of the semiconductor structure in high integration level. If the pitch W between the adjacent first comb tooth parts 110 and second comb tooth parts 320 is too small, the second dielectric layer 122 between the adjacent first comb tooth parts 110 and second comb tooth parts 320 is likely to be broken through, which influences reliability of the semiconductor structure. Thus, in this implementation, the pitch W between the adjacent first comb tooth parts 110 and second comb tooth parts 320 is 10 nm to 30 nm in the arrangement direction of the first comb tooth parts 110.

In this implementation, the second electrode layer 300 is located on the two sides of the first comb handle part 140, and the second comb tooth parts 320 on the second electrode layer 300 on each side and the first comb tooth parts 110 on the same side are parallel in the crossed manner.

Specifically, the two sides of the first comb handle part 140 are both provided with the plurality of first comb tooth parts 110 connected therewith. Correspondingly, in the process for forming the second electrode layer 300, the second electrode layer 300 is also located on the two sides of the first comb handle part 140, moreover, the second comb tooth parts 320 on the second electrode layer 300 on each side and the first comb tooth parts 110 on the same side are parallel in the crossed manner, that is, the second comb tooth parts 320 and the first comb tooth parts 110 on each side and the second dielectric layer 122 between the second comb tooth parts 320 and the first comb tooth parts 110 form the MOM capacitor, and thus, the two MOM capacitors share the first comb handle part 140. The same first comb handle part 140 electrifies the first comb tooth parts 110 on the two sides thereof, thereby reducing the occupied area of the MOM capacitors, improving the space utilization rate of the MOM capacitors, and then improving the integration level of the semiconductor structure.

In this implementation, the second electrode layer 300 is located in the second dielectric layer 122, and located on the top surface of the first dielectric layer 121.

It can be known from the foregoing that the dielectric layer 620 includes the first dielectric layer 121 and the second dielectric layer 122 located at the top of the first dielectric layer 121. In the process for forming the second electrode layer 300, the first dielectric layer 121 has the function of stopping etch, which reduces the probability of over etching of the base 120, and thus, a second electrode is formed in the second dielectric layer 122 and located on the top surface of the first dielectric layer 121.

In this implementation, in the arrangement direction of the second comb tooth parts 320, a width of the second comb tooth part 320 located on an outermost side is greater than or equal to widths of the rest of second comb tooth parts 320.

In this implementation, the semiconductor structure further includes: a first via interconnect structure 170 located on the top of the first comb handle part 140 and electrically connected to the first comb handle part 140. The first via interconnect structure 170 includes a first sub via interconnect structure 150 and a second sub via interconnect structure 160 which are located at two ends of the first comb handle part 140 respectively.

The first sub via interconnect structure 150 is configured to access the input signal, and the second sub via interconnect structure 160 is configured to access the output signal.

The first via interconnect structure 170 is configured to realize electrical connection between the first comb handle part 140 and the periphery.

Specifically, the first sub via interconnect structure 150 accesses the input signal, the second sub via interconnect structure 160 accesses the output signal, and thus, the plurality of first comb tooth parts 110 are connected to the circuit through the first sub via interconnect structure 150 and the second sub via interconnect structure 160 located at the two ends of the first comb handle part 140 respectively. Accordingly, the plurality of first comb tooth parts 110 serve as the electrode plate of the MOM capacitor and the plurality of first comb tooth parts 110 are also connected to the circuit to form the three-terminal MOM capacitor.

In this implementation, the material of the first via interconnect structure 170 includes at least one of aluminum, copper, titanium nitride, cobalt or tantalum nitride.

Specifically, aluminum, copper, titanium nitride, cobalt and tantalum nitride have low specific resistance, so that a resistance value generated by the first via interconnect structure 170 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

In this implementation, the semiconductor structure further includes: a second via interconnect structure 230 located on the top of the second comb handle part 310, electrically connected to the second comb handle part 310 and configured to be grounded.

The second via interconnect structure 230 is configured to realize electrical connection between the second comb handle part 310 and the external circuit structure.

Specifically, the second via interconnect structure 230 is grounded, so that the second comb tooth parts 320 are grounded.

In this implementation, the material of the second via interconnect structure 230 includes one or more of aluminum, copper, titanium nitride, cobalt and tantalum nitride.

Specifically, aluminum, copper, titanium nitride, cobalt and tantalum nitride have low specific resistance, so that a resistance value generated by the second via interconnect structure 230 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

FIG. 5 to FIG. 13 are schematic structural diagrams corresponding to steps of one form of a method for forming a semiconductor structure.

Figure 5:
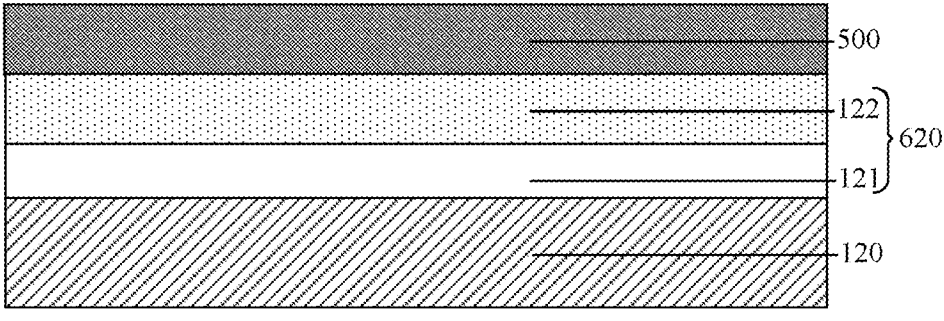
FIG. 5 to FIG. 13 are schematic structural diagrams corresponding to steps of one form of a method for forming a semiconductor structure.
Figures 6, 7:
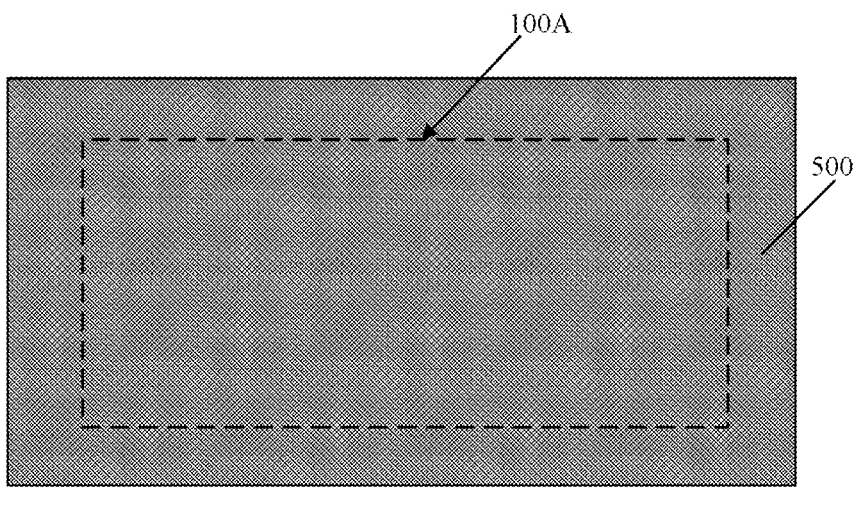

Referring to FIG. 5-FIG. 6, FIG. 6 is a top view, FIG. 5 is a section view of FIG. 6, and a base 120 is provided.

The base 120 is configured to provide a process platform for a process for forming a semiconductor structure later.

In this implementation, the base 120 includes a substrate (not shown in the figure), and the substrate is a silicon substrate. In other implementations, the material of the substrate may alternatively be germanium, silicon germanide, silicon carbide, gallium arsenide or indium gallide or the like, and the substrate may alternatively be a silicon substrate on an insulator or a germanium substrate on the insulator or another type of substrate.

In this implementation, in the step of providing the base 120, a dielectric layer 620 is formed on the base 120 and includes a first dielectric layer 121 and a second dielectric layer 122 located at a top of the first dielectric layer 121, and the second dielectric layer 122 and the first dielectric layer 121 have etching selection ratio.

The dielectric layer 620 provides a process basis for forming a first electrode layer and a second electrode layer later.

In this implementation, the material of the dielectric layer 620 includes one or more of silicon oxide, silicon nitride, silicon oxynitride, silicon oxycarbide, silicon carbonitride and silicon oxy-carbonitride.

Specifically, in the later process for forming the first electrode layer and the second electrode layer, the second dielectric layer 122 and the first dielectric layer 121 have the etching selection ratio, and the first dielectric layer 121 can have a function of stopping etch, thereby reducing the phenomenon of over etching in the process of forming the first electrode layer and the second electrode layer, and reducing the probability of damaging the base 120.

The second dielectric layer 122 provides a spatial position for later forming of the first electrode layer and the second electrode layer. Meanwhile, the second dielectric layer 122 is further configured to electrically isolate the first electrode layer and the second electrode layer formed later, and reducing the risk of electric leakage between the adjacent first electrode layer and the second electrode layer.

In this implementation, the material of the first dielectric layer 121 includes at least one of silicon oxynitride, silicon oxycarbide, silicon carbonitride or silicon oxy-carbonitride, and the material of the second dielectric layer 122 includes one or more of silicon oxide, silicon nitride and silicon oxynitride.

In this implementation, in the step of providing the base 120, a pattern transfer layer 500 is further formed on the top of the dielectric layer, and in a direction parallel to a surface of the pattern transfer layer 500, the pattern transfer layer 500 includes a capacitance region 100A.

A capacitor is later formed in the dielectric layer 620 below the capacitance region 100A.

Specifically, in the later process of forming the first electrode layer and the second electrode layer, the pattern transfer layer 500 is used as an etch mask layer, and patterning treatment is performed on the second dielectric layer 122 with the pattern transfer layer 500 as a mask, thereby forming the first electrode layer and the second electrode layer in the second dielectric layer 122, and then improving pattern transfer precision.

In this implementation, the material of the pattern transfer layer 500 includes amorphous silicon.

It should be noted that the hardness of the amorphous silicon material is low, which reduces etching difficulty of later forming a first comb handle mask opening, first comb tooth mask openings, a second comb handle mask opening and second comb tooth mask openings in the pattern transfer layer 500. Meanwhile, the amorphous silicon has instability, that is, atoms of the amorphous silicon material have a large quantity of dangling bonds, which facilitate later doping treatment on the pattern transfer layer 500 located in the capacitance region 100A to make the pattern transfer layer 500 in the capacitance region 100A and the pattern transfer layer 500 on an outer side of the capacitance region 100A have etching selection ratio. Correspondingly, in the process of removing the remaining pattern transfer layer 500 in the capacitance region 100A, etching selection ratio between a sacrificial layer in the capacitance region 100A and a sacrificial layer on the outer side of the capacitance region 100A can be utilized, thereby realizing the effect of thoroughly removing the remaining pattern transfer layer 500 in the capacitance region 100A.

Referring to FIG. 7 to FIG. 13, the first electrode layer 100 is formed on the base 120 and includes a first comb handle part 140 and a plurality of first comb tooth parts 110 connected to the first comb handle part 140 and arranged in parallel, one end of the first comb handle part 140 is configured to access an input signal, and the other end is configured to access an output signal. The second electrode layer 300 is formed on the base 120, and located on the same layer with the first electrode layer 100 and includes a second comb handle part 310 and a plurality of second comb tooth parts 320 connected to the second comb handle part 310 and arranged in parallel, the second comb tooth parts 320 and the first comb tooth parts 110 are parallel in a crossed manner, and the second comb handle part 310 is configured to be grounded.

It should be noted that the first comb tooth parts 110 and the second comb tooth parts 320 form the capacitor, one end of the first comb handle part 140 is configured to access signal input, the other end is configured to access signal output, the first comb tooth parts 110 serve as an electrode plate of the capacitor, and meanwhile, the first comb tooth parts 110 are connected to a circuit, so that the first electrode layer 100 and the second electrode layer 300 form a three-terminal capacitor. Accordingly, grounded inductance of the capacitor is reduced, thereby improving a high-frequency filter function of the capacitor. In addition, through an electric connection lead formed after one end of the first comb handle part accesses the input signal and the other end accesses the output signal, a current flows in from an Input and flows out from an Output and penetrates through the MOM capacitor. Accordingly, a T-type lowpass filter is formed by lead inductance, thereby improving the work performance of the semiconductor structure.

In this implementation, in the step of forming the first electrode layer 100, two sides of the first comb handle part 140 are both provided with the plurality of first comb tooth parts 110 connected therewith.

Specifically, the two sides of the first comb handle part 140 are both provided with the plurality of first comb tooth parts 110 connected therewith, that is, the first comb tooth parts 110 on the two sides of the first comb handle part 140 share the first comb handle part 140, and the same first comb handle part 140 electrifies the first comb tooth parts 110 on the two sides thereof to form two MOM capacitors, thereby reducing an occupied area of the MOM capacitors, improving a space utilization rate of the MOM capacitors, and then improving an integration level of the semiconductor structure.

In this implementation, in the step of forming the first electrode layer 100 on the base 120, the first electrode layer 100 located on a top surface of the first dielectric layer 121 is formed in the second dielectric layer 122.

It can be known from the foregoing that the first dielectric layer 121 and the second dielectric layer 122 located at the top of the first dielectric layer 121 are formed on the base 120, in the process of forming the first electrode layer 100, the first dielectric layer 121 has the function of stopping etch, which reduces the probability of over etching of the base 120, and thus, a first electrode is formed in the second dielectric layer 122 and located on the top surface of the first dielectric layer 121.

It should be noted that in this implementation, the first comb handle part 140 in the first electrode layer 100 extends in a first direction (a Y direction in FIG. 13), the plurality of first comb tooth parts 110 in the first electrode layer 100 extend in a second direction (an X direction in FIG. 13) and are arranged in the first direction, and the first direction is perpendicular to the second direction.

In this implementation, the first electrode layer 100 is used as an electrode plate of the MOM capacitor.

Specifically, the first comb tooth parts 110 in the first electrode layer 100 are used as the electrode plate of the MOM capacitor, and the first comb handle part 140 is connected to each first comb tooth part 110, so as to realize, through electric connection between the first comb handle part 140 and an external circuit structure, electric connection between the first comb tooth parts 110 and the external circuit structure.

In this implementation, one end of the first comb handle part 140 is configured to access the input signal, and the other end is configured to access the output signal.

One end of the first comb handle part 140 is configured to access the input signal, and the other end is configured to access the output signal, so that the plurality of first comb tooth parts 110 are connected to the circuit through the first comb handle part 140.

Accordingly, the plurality of first comb tooth parts 110 are also connected to the circuit when serving as the electrode plate of the MOM capacitor, thereby forming a three-terminal MOM capacitor. As shown in FIG. 4, FIG. 4 illustrates a circuit diagram corresponding to the capacitor provided by the embodiment, through the electric connection lead formed after one end of the first comb handle part 140 accesses the input signal and the other end accesses the output signal, the current flows in from the Input and flows out from the Output in an arrow direction and penetrates through the MOM capacitor. Accordingly, the T-type lowpass filter is formed by ingeniously utilizing the lead inductance.

In this implementation, the first electrode layer 100 is composed of a metal wire, that is, the first electrode layer 100 is made of a metal material.

In this implementation, the material of the first electrode layer 100 includes at least one of aluminum, copper, titanium nitride, cobalt or tantalum nitride.

Specifically, aluminum, copper, titanium nitride, cobalt and tantalum nitride have low specific resistance, so that a resistance value generated by the first electrode layer 100 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

In this implementation, the second electrode layer 300 is used as another electrode plate of the MOM capacitor.

Specifically, the second comb tooth parts 320 in the second electrode layer 300 are used as the electrode plate of the MOM capacitor, and the second comb handle part 310 is connected to each second comb tooth part 320, so as to realize, through electric connection between the second comb handle part 310 and the external circuit structure, electric connection between the second comb tooth parts 320 and the external circuit structure.

In this implementation, the second comb handle part 310 is configured to be grounded, and correspondingly, the second comb tooth parts 320 are grounded.

In this implementation, the second comb tooth parts 320 and the first comb tooth parts 110 are parallel in the crossed manner.

Specifically, there is a potential difference between the first electrode layer 100 and the second electrode layer 300, accordingly, there is the potential difference between the second comb tooth parts 320 and the first comb tooth parts 110, so that the second comb tooth parts 320 and the first comb tooth parts 110 are parallel in the crossed manner. The adjacent second comb tooth parts 320 and first comb tooth parts 110 and the second dielectric layer 122 between the second comb tooth parts 320 and the first comb tooth parts 110 form the metal-oxide-metal (MOM) capacitor.

In this implementation, the second electrode layer 300 is composed of a metal wire, that is, the second electrode layer 300 is made of a metal material.

Specifically, in this implementation, the material of the second electrode layer 300 includes at least one of aluminum, copper, titanium nitride, cobalt or tantalum nitride.

Specifically, aluminum, copper, titanium nitride, cobalt and tantalum nitride have low specific resistance, so that a resistance value generated by the second electrode layer 300 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

In this implementation, the second electrode layer 300 and the first electrode layer 100 are located on the same layer, that is, the first electrode layer 100 and the second electrode layer 300 are formed in the same step, and thus, in this implementation, the first electrode layer 100 and the second electrode layer 300 are the same in material, which facilitates the technological process to be simplified, and improves the process efficiency.

It should be noted that a pitch W between the adjacent first comb tooth parts 110 and second comb tooth parts 320 should not be too large or small in the arrangement direction of the first comb tooth parts 110. If the pitch W between the adjacent first comb tooth parts 110 and second comb tooth parts 320 is too large, capacitance of the MOM capacitor formed by the adjacent first comb tooth parts 110 and second comb tooth parts 320 is likely to be too low, the quantity of electric charge borne by the MOM capacitor is too small, and thus, it is difficult for the formed MOM capacitor to bring enough loads, which influences the work performance of the semiconductor structure. In addition, the too large pitch between the adjacent first comb tooth parts 110 and second comb tooth parts 320 is likely to cause the too large occupied area of the formed MOM capacitor, which does not facilitate development of the semiconductor structure in high integration level.

If the pitch W between the adjacent first comb tooth parts 110 and second comb tooth parts 320 is too small, the second dielectric layer 122 between the adjacent first comb tooth parts 110 and second comb tooth parts 320 is likely to be broken through, which influences reliability of the semiconductor structure. Thus, in this implementation, the pitch W between the adjacent first comb tooth parts 110 and second comb tooth parts 320 is 10 nm to 30 nm in the arrangement direction of the first comb tooth parts 110.

In this implementation, in the step of forming the second electrode layer 300, the second electrode layer 300 is located on the two sides of the first comb handle part 140, and the second comb tooth parts 320 on the second electrode layer 300 on each side and the first comb tooth parts 110 on the same side are parallel in the crossed manner.

Specifically, the two sides of the first comb handle part 140 are both provided with the plurality of first comb tooth parts 110 connected therewith. Correspondingly, in the step of forming the second electrode layer 300, the second electrode layer 300 is also located on the two sides of the first comb handle part 140, moreover, the second comb tooth parts 320 on the second electrode layer 300 on each side and the first comb tooth parts 110 on the same side are parallel in the crossed manner, that is, the second comb tooth parts 320 and the first comb tooth parts 110 on each side and the second dielectric layer 122 between the second comb tooth parts 320 and the first comb tooth parts 110 form the MOM capacitor, and thus, the two MOM capacitors share the first comb handle part 140. The same first comb handle part 140 electrifies the first comb tooth parts 110 on the two sides thereof, thereby reducing the occupied area of the MOM capacitors, improving the space utilization rate of the MOM capacitors, and then improving the integration level of the semiconductor structure.

In this implementation, in the step of forming the second electrode layer 300 on the base 120, a second electrode located on the top surface of the first dielectric layer 121 is formed in the second dielectric layer 122.

It can be known from the foregoing that the first dielectric layer 121 and the second dielectric layer 122 located at the top of the first dielectric layer 121 are formed on the base 120, in the step of forming the second electrode layer 300, the first dielectric layer 121 has the function of stopping etch, which reduces the probability of over etching of the base 120, and thus, the second electrode is formed in the second dielectric layer 122 and located on the top surface of the first dielectric layer 121.

Figure 12:
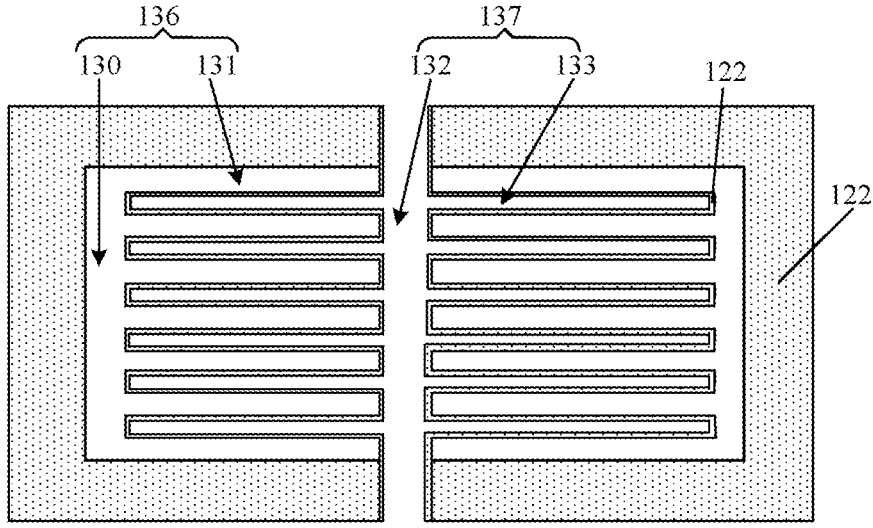

In this implementation, the step of forming the first electrode layer 100 and the second electrode layer 300 includes: as shown in FIG. 12, a first electrode groove 137 and a second electrode groove 136 are formed in the dielectric layer 620, where the first electrode groove 137 includes a first comb handle groove 132 and a plurality of first comb tooth grooves 133 connected to the first comb handle groove 132 and arranged in parallel, the second electrode groove 136 includes a second comb handle groove 130 and a plurality of second comb tooth grooves 131 connected to the second comb handle groove 130 and arranged in parallel, and the second comb tooth grooves 131 and the first comb tooth grooves 133 are parallel in a crossed manner.

Figure 13:
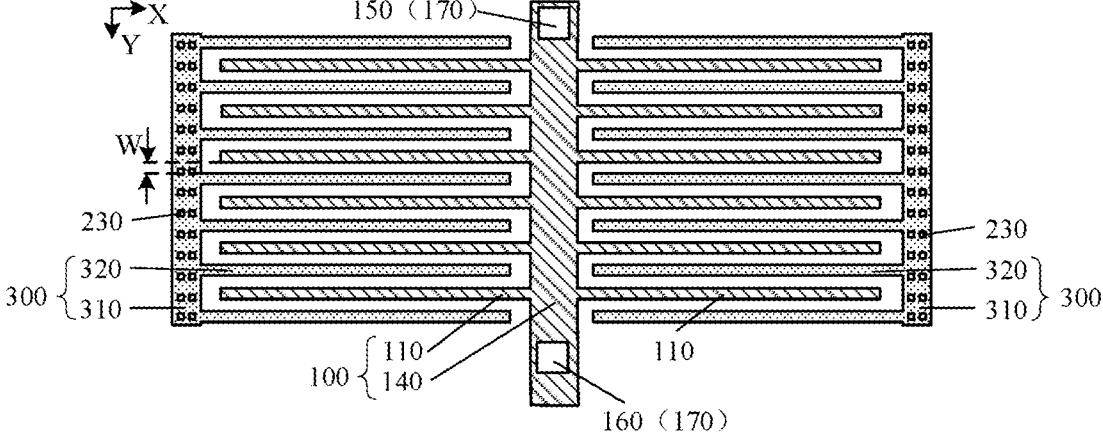

As shown in FIG. 13, conductive materials are formed in the first electrode groove 137 and the second electrode groove 136, where the conductive materials located in the first electrode groove 137 are used as the first electrode, including the first comb handle part 140 located in the first comb handle groove 132 and the first comb tooth parts 110 located in the first comb tooth grooves 133, and the conductive materials located in the second electrode groove 136 are used as the second electrode, including the second comb handle part 310 located in the second comb handle groove 130 and the second comb tooth parts 320 located in the second comb tooth grooves 131.

The first electrode groove 137 provides a spatial position for forming the first electrode layer 100. Specifically, in this implementation, the first electrode groove 137 is located in the second dielectric layer 122.

The second electrode groove 136 provides a spatial position for forming the second electrode layer 300.

Specifically, in this implementation, the second electrode groove 136 is located in the second dielectric layer 122.

In this implementation, a process for forming the conductive materials in the first electrode groove 137 and the second electrode groove 136 includes an electrochemical plating process.

As an example, after the conductive materials are formed in the first electrode groove 137 and the second electrode groove 136, the method further includes: planarization treatment is performed on the conductive materials so as to remove the conductive materials higher than the top of the dielectric layer 620 and reserve the conductive materials located in the first electrode groove 137 and the second electrode groove 136.

The step of forming the first electrode groove 137 and the second electrode groove 136 is described in detail with reference to FIG. 7 to FIG. 12.

Figures 8, 9:
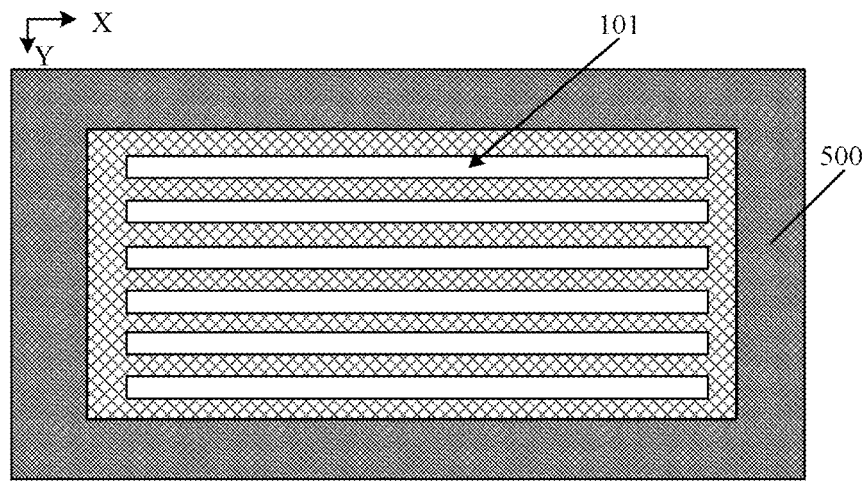

Referring to FIG. 8, the plurality of first comb tooth mask openings 101 located in the pattern transfer layer 500 at intervals in parallel are formed in the capacitance region 100A.

Specifically, in the later process of patterning treatment on the dielectric layer 620, the first comb tooth mask openings 101 are used as mask openings for forming the first comb tooth parts 110, which provide a process basis for forming the first comb tooth parts 110 in the second dielectric layer 122.

In this implementation, the process for forming the first comb tooth mask openings 101 includes a dry etch process.

It should be noted that the dry etch process is an anisotropic dry etch process. The anisotropic dry etch process has an anisotropic etching character, has a longitudinal etching rate higher than a transverse etching rate, and has the characteristics of being high in etching controllability, etc. The first comb tooth mask openings 101 are formed by the dry etch process, which can improve the profile quality of side walls of the first comb tooth mask openings 101, and in the later process of patterning treatment on the dielectric layer 620, the pattern transfer precision is improved. Meanwhile a process basis is provided for forming a mask spacer layer on the side walls of the first comb tooth mask openings 101.

In this implementation, the first comb tooth mask openings 101 extend in a second direction (an X direction in FIG. 8) and are arranged in a first direction (a Y direction in FIG. 8).

In this implementation, through a first photolithography mask layer (not shown in the figure), the plurality of first comb tooth mask openings 101 arranged at intervals in parallel are formed in the pattern transfer layer 500, and the first photolithography mask layer has patterns corresponding to the first comb tooth mask openings 101.

Referring to FIG. 9, the first comb handle mask opening 102 penetrating through the capacitance region 100A is formed in the pattern transfer layer 500, and the first comb handle mask opening 102 communicates with the plurality of first comb tooth mask openings 101. Specifically, the first comb handle mask opening 102 penetrates through the capacitance region 100A in the first direction.

In the later process of patterning treatment on the dielectric layer 620, the first comb handle mask opening 102 is used as a mask opening for forming the first comb handle part 140, which provides a process basis for forming the first comb handle part 140 in the second dielectric layer 122.

Meanwhile, the first comb handle mask opening 102 communicates with the plurality of first comb tooth mask openings 101, so that the first comb handle groove 132 formed in the dielectric layer communicates with the first comb tooth grooves 133. Accordingly, the first comb handle part 140 formed in the first comb handle groove 132 can be electrically connected to the first comb tooth parts 110 formed in the first comb tooth grooves 133.

In this implementation, the process for forming the first comb handle mask opening 102 includes the dry etch process.

It should be noted that the dry etch process is an anisotropic dry etch process. The anisotropic dry etch process has the anisotropic etching character, has the longitudinal etching rate higher than the transverse etching rate, and has the characteristics of being high in etching controllability, etc. The first comb handle mask opening 102 is formed by the dry etch process, which can improve the profile quality of a side wall of the first comb handle mask opening 102; and in the later process of patterning treatment on the dielectric layer 620, the pattern transfer precision is improved. Meanwhile a process basis is provided for forming the mask spacer layer on the side wall of the first comb handle mask opening 102.

In this implementation, through a second photolithography mask layer (not shown in the figure), the first comb handle mask opening 102 penetrating through the capacitance region 100A is formed in the pattern transfer layer 500, and the second photolithography mask layer has a pattern corresponding to the first comb handle mask opening 102.

In this implementation, after the plurality of first comb tooth mask openings 101 located in the pattern transfer layer 500 at intervals in parallel are formed in the capacitance region 100A, the first comb handle mask opening 102 penetrating through the plurality of first comb tooth mask openings 101 is formed in the pattern transfer layer 500.

In other implementations, the first comb handle mask opening 102 can be firstly formed, and then the first comb tooth mask openings 101 are formed.

In this implementation, the first comb handle mask opening 102 penetrates through the plurality of first comb tooth mask openings 101.

Herein, the penetrating through the plurality of first comb tooth mask openings 101 refers to: the first comb handle mask opening 102 penetrating into the plurality of first comb tooth mask openings 101; or the first comb handle mask opening 102 penetrating through end portions of the first comb tooth mask openings 101.

As an example, the first comb handle mask opening 102 penetrates into the first comb tooth mask openings 101, so that the two sides of the first comb handle part are later both provided with the plurality of first comb tooth parts connected therewith.

Figure 10:
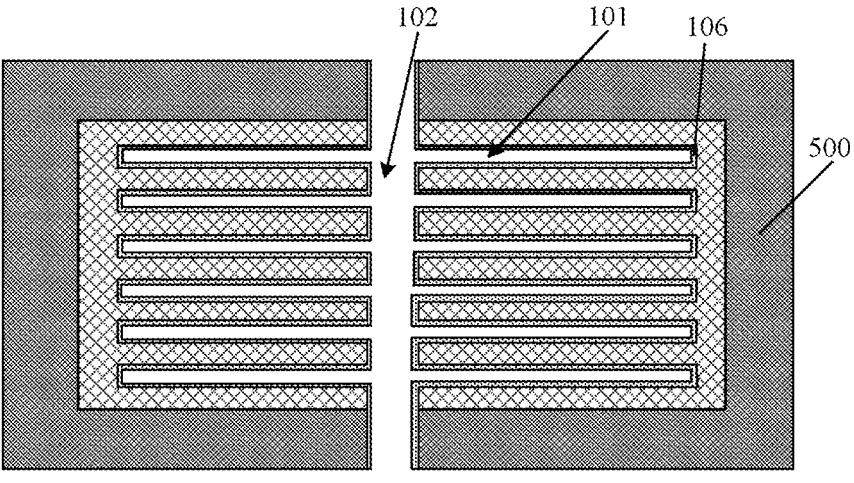

Referring to FIG. 10, the mask spacer layer 106 is formed on the side wall of the first comb handle mask opening 102 and the side walls of the first comb tooth mask openings 101.

In the later process of patterning treatment on the dielectric layer 620, the mask spacer layer 106 is used as an etch mask. Furthermore, the mask spacer layer 106 is also configured to define a distance between the first comb tooth mask openings 101 and the second comb tooth mask openings, so that the first comb tooth parts 110 and the second comb tooth parts 320 formed later are isolated, and the distance between the first comb tooth parts 110 and the second comb tooth parts 320 satisfies a process size requirement.

In this implementation, the step of forming the mask spacer layer 106 includes: a mask spacer material layer is formed at a bottom and the side wall of the first comb handle mask opening 102, bottoms and the side walls of the first comb tooth mask openings 101 and a top of the pattern transfer layer 500; and the mask spacer material layer at the bottom of the first comb handle mask opening 102, the bottoms of the first comb tooth mask openings 101 and the top of the pattern transfer layer 500 is removed, and the remaining mask spacer material layer located on the side wall of the first comb handle mask opening 102 and the side walls of the first comb tooth mask openings 101 is used as the mask spacer layer 106.

In this implementation, the process for forming the mask spacer material layer includes an atomic layer deposition process.

In this implementation, the process for removing the mask spacer material layer at the bottom of the first comb handle mask opening 102, the bottoms of the first comb tooth mask openings 101 and the top of the pattern transfer layer 500 includes the dry etch process.

In this implementation, the material of the mask spacer layer 106 includes at least one of silicon oxide, silicon nitride, silicon oxynitride, silicon oxycarbide, silicon carbonitride or silicon oxy-carbonitride.

Figure 11:
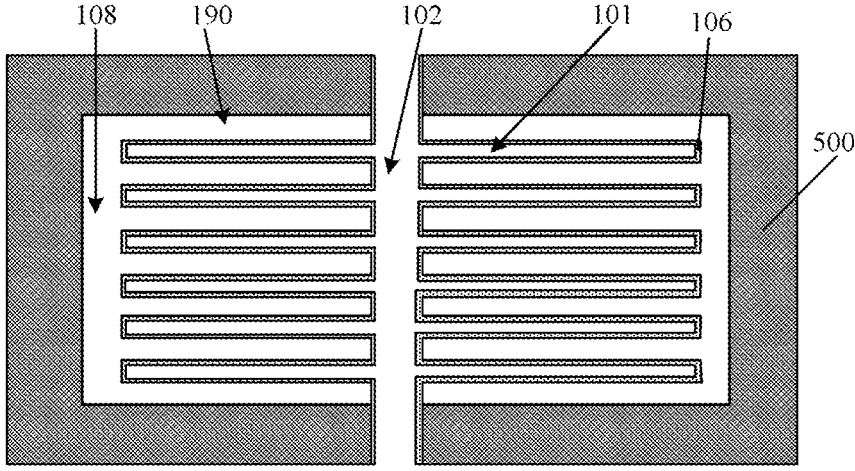

Referring to FIG. 11, after the mask spacer layer 106 is formed, the remaining pattern transfer layer 500 in the capacitance region 100A is removed so as to form the plurality of second comb tooth mask openings 190 which are arranged at intervals in parallel and are parallel to the first comb tooth mask openings 101 in a crossed manner and the second comb handle mask opening 108 which is located in the side, away from the first comb handle mask opening 102, of the first comb tooth mask openings 101 and communicates with the second comb tooth mask openings 190. The second comb tooth mask openings 190 and the second comb handle mask opening 108 are spaced from the first comb tooth mask openings 101 through the mask spacer layer 106.

Specifically, in the later process of patterning treatment on the dielectric layer 620, the second comb tooth mask openings 190 are used as mask openings for forming the second comb tooth grooves 131, which provide a process basis for forming the second comb tooth parts 320 in the second dielectric layer 122. The second comb handle mask opening 108 is used as the mask opening for forming the second comb handle groove 130, which provides a process basis for forming the second comb handle part 310 in the second dielectric layer 122.

It should be noted that the second comb tooth mask openings 190 correspond to the second comb tooth grooves 131, and the second comb handle mask opening 108 corresponds to the second comb handle groove 130.

Referring to FIG. 12, the remaining pattern transfer layer 500 of the mask spacer layer 106 serves as the mask, patterning treatment is performed on the dielectric layer 620 along the first comb handle mask opening 102, the first comb tooth mask openings 101, the second comb handle mask opening 108 and the second comb tooth mask openings 190, and the first electrode groove 137 and the second electrode groove 136 are formed in the dielectric layer 620.

The first electrode groove 137 provides the spatial position for forming the first electrode layer 100, and the second electrode groove 136 is configured to provide the spatial position for forming the second electrode layer 300.

In this implementation, the process for performing patterning treatment on the dielectric layer 620 includes the dry etch process. It should be noted that the dry etch process is an anisotropic dry etch process. The anisotropic dry etch process has the anisotropic etching character, has the longitudinal etching rate higher than the transverse etching rate, and has the characteristics of being high in etching controllability, etc. The dielectric layer 620 is subjected to patterning treatment through the dry etch process, which can improve the profile quality of the first electrode groove 137 and the second electrode groove 136, and pattern transfer precision and quality. Meanwhile a process basis is provided for forming the first electrode layer 100 and the second electrode layer 300 in the first electrode groove 137 and the second electrode groove 136.

It is to be further explained that the first comb handle mask opening 102 correspondingly forms the first comb handle groove 132, the first comb tooth mask openings 101 correspondingly form the first comb tooth grooves 133, and the first comb handle groove 132 and the first comb tooth grooves 133 form the first electrode groove 137. The second comb tooth mask openings 190 correspondingly form the second comb tooth grooves 131, the second comb handle mask opening 108 correspondingly forms the second comb handle groove 130, and the second comb tooth grooves 131 and the second comb handle groove 130 form the second electrode groove 136.

In this implementation, in the step of performing patterning treatment on the dielectric layer 620, the top of the first dielectric layer 121 serves as an etch stop position, and correspondingly, the first electrode groove 137 and the second electrode groove 136 are formed in the second dielectric layer 122.

Referring to FIG. 7, before the plurality of first comb tooth mask openings 101 located in the pattern transfer layer 500 at intervals in parallel are formed in the capacitance region 100A of the pattern transfer layer 500, the method further includes: doping treatment is performed on the pattern transfer layer 500 of the capacitance region 100A to make the pattern transfer layer 500 in the capacitance region 100A and the pattern transfer layer 500 on the outer side of the capacitance region 100A have the etching selection ratio.

It should be noted that the doping treatment is performed on the pattern transfer layer 500 of the capacitance region 100A to make the pattern transfer layer 500 in the capacitance region 100A and the pattern transfer layer 500 on the outer side of the capacitance region 100A have the etching selection ratio. Correspondingly, in the process of removing the remaining pattern transfer layer 500 in the capacitance region 100A, the etching selection ratio between the pattern transfer layer 500 in the capacitance region 100A and the pattern transfer layer 500 on the outer side of the capacitance region 100A can be utilized, and the etching process is adopted to realize the effect of thoroughly removing the remaining pattern transfer layer 500 in the capacitance region 100A, and reducing damage to the pattern transfer layer 500 on the outer side of the capacitance region 100A.

In addition, by making the pattern transfer layer 500 in the capacitance region 100A and the pattern transfer layer 500 on the outer side of the capacitance region 100A have the etching selection ratio, a blanket etch manner is conveniently adopted to remove the remaining pattern transfer layer 500 in the capacitance region 100A, thereby enlarging a process window for removing the remaining pattern transfer layer 500 in the capacitance region 100A, and reducing the process cost.

In this implementation, ions for performing the doping treatment on the pattern transfer layer 500 in the capacitance region 100A include at least one of C, B and P.

Specifically, the C, B and P ions are often selected in the doping treatment process and have the characteristics of low process cost, etc., and meanwhile the pattern transfer layer 500 in the capacitance region 100A and the pattern transfer layer 500 on the outer side of the capacitance region 100A have the etching selection ratio through the C, B and P ions.

It should be noted that in this implementation, the step of removing the remaining pattern transfer layer 500 in the capacitance region 100A includes: the remaining pattern transfer layer 500 in the capacitance region 100A is removed by utilizing etching selection ratio between a sacrificial layer in the capacitance region 100A and a sacrificial layer on the outer side of the capacitance region 100A.

In this implementation, the process for removing the remaining pattern transfer layer 500 in the capacitance region 100A includes a wet etch process.

The wet etch process is an isotropous etching process and has high longitudinal and transverse etching rates. The wet etch process can be adopted to select the high etching selection ratio to achieve the purposes of thoroughly removing the remaining pattern transfer layer 500 in the capacitance region 100A, and meanwhile reducing the probability of damaging other film layers.

It should be noted that the etching selection ratio between the pattern transfer layer 500 in the capacitance region 100A and the pattern transfer layer 500 on the outer side of the capacitance region 100A should not be too low. If the etching selection ratio between the pattern transfer layer 500 in the capacitance region 100A and the pattern transfer layer 500 on the outer side of the capacitance region 100A is too low, in the process of removing the remaining pattern transfer layer 500 in the capacitance region 100A, the pattern transfer layer 500 on the outer side of the capacitance region 100A is likely to be removed as well. As a result, in the process of performing patterning treatment on the dielectric layer 620, the pattern transfer precision and quality are influenced, and the dielectric layer 620 on the outer side of the capacitance region 100A is exposed, which increases the probability of damaging the dielectric layer 620 on the outer side of the capacitance region 100A. Thus, in this implementation, the etching selection ratio between the pattern transfer layer 500 in the capacitance region 100A and the pattern transfer layer 500 on the outer side of the capacitance region 100A is greater than 120:1.

Continuously referring to FIG. 13, after the first electrode layer 100 and the second electrode layer 300 are formed, forming the semiconductor structure further includes: a first via interconnect structure 170 is formed on the top of the first comb handle part 140 and electrically connected to the first comb handle part 140, where the first via interconnect structure 170 includes a first sub via interconnect structure 150 and a second sub via interconnect structure 160 which are located at two ends of the first comb handle part 140 respectively, the first sub via interconnect structure 150 is configured to access an input signal, and the second sub via interconnect structure 160 is configured to access an output signal; and a second via interconnect structure 230 is formed on the top of the second comb handle part 310, electrically connected to the second comb handle part 310 and configured to be grounded.

The first via interconnect structure 170 is configured to realize electrical connection between the first comb handle part 140 and the periphery.

Specifically, in this implementation, the first sub via interconnect structure 150 accesses the input signal, the second sub via interconnect structure 160 accesses the output signal, and thus, the plurality of first comb tooth parts 110 are connected to the circuit through the first sub via interconnect structure 150 and the second sub via interconnect structure 160 located at the two ends of the first comb handle part 140 respectively. Accordingly, the plurality of first comb tooth parts 110 serve as an electrode plate of the MOM capacitor and the plurality of first comb tooth parts 110 are also connected to the circuit to form the three-terminal MOM capacitor.

In this implementation, the material of the first via interconnect structure 170 includes at least one of aluminum, copper, titanium nitride, cobalt or tantalum nitride.

Specifically, aluminum, copper, titanium nitride, cobalt and tantalum nitride have low specific resistance, so that a resistance value generated by the first via interconnect structure 170 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

The second via interconnect structure 230 is configured to realize electrical connection between the second comb handle part 310 and the periphery.

Specifically, in this implementation, the second via interconnect structure 230 is grounded, so that the second comb tooth parts 320 are grounded.

In this implementation, the material of the second via interconnect structure 230 includes at least one of aluminum, copper, titanium nitride, cobalt or tantalum nitride.

Specifically, aluminum, copper, titanium nitride, cobalt and tantalum nitride have low specific resistance, so that a resistance value generated by the second via interconnect structure 230 is low, and the performance of the MOM capacitor structure is improved. Meanwhile, aluminum, copper, titanium nitride, cobalt and tantalum nitride have fast electronic mobility so as to have high conductivity, thereby further improving the electrical property of the MOM capacitor structure.

Although the present disclosure describes embodiments and implementations above, the present disclosure is not limited thereto. Various changes and modifications may be made by those skilled in the art without departing from the spirit and scope of the present disclosure, and therefore the protection scope of the present disclosure shall be as defined by the claims.

What is claimed is:

1. A semiconductor structure, comprising:
   a base;
   a first electrode layer, wherein the first electrode layer is located on the base and comprises a first comb handle part and a plurality of first comb tooth parts connected to the first comb handle part and arranged in parallel, where one end of the first comb handle part is configured to access an input signal, and the other end of the first comb handle part is configured to access an output signal;
   a first via interconnect structure located on a top of the first comb handle part and electrically connected to the first comb handle part, wherein the first via interconnect structure comprises a first sub via interconnect structure and a second sub via interconnect structure which are located at two ends of the first comb handle part respectively; and
   a second electrode layer, wherein the second electrode layer is located on the base and located on the same layer with the first electrode layer, and comprises a second comb handle part and a plurality of second comb tooth parts connected to the second comb handle part and arranged in parallel, where the second comb tooth parts and the first comb tooth parts are parallel in a crossed manner, and the second comb handle part is configured to be grounded.

2. The semiconductor structure according to claim 1, wherein:
   two sides of the first comb handle part are both provided with the plurality of first comb tooth parts connected therewith; and
   the second electrode layer is located on the two sides of the first comb handle part, and the second comb tooth parts on the second electrode layer on each side and the first comb tooth parts on the same side are parallel in the crossed manner.

3. The semiconductor structure according to claim 1, further comprising:
   a dielectric layer located on the base, wherein the dielectric layer comprises a first dielectric layer and a second dielectric layer located at a top of the first dielectric layer, where the second dielectric layer and the first dielectric layer have etching selection ratio;

wherein both the first electrode layer and the second electrode layer are located in the second dielectric layer, and are located on a top surface of the first dielectric layer.

4. The semiconductor structure according to claim 1, wherein a pitch between adjacent first comb tooth parts and second comb tooth parts is 10 nm to 30 nm in an arrangement direction of the first comb tooth parts.

5. The semiconductor structure according to claim 1, wherein in an arrangement direction of the second comb tooth parts, a width of the second comb tooth part located on an outermost side is greater than or equal to widths of the rest of the second comb tooth parts.

6. The semiconductor structure according to claim 1, where the first sub via interconnect structure is configured to access the input signal, and the second sub via interconnect structure is configured to access the output signal; and the semiconductor structure further comprises:

a second via interconnect structure located on a top of the second comb handle part, electrically connected to the second comb handle part and configured to be grounded.

7. The semiconductor structure according to claim 1, wherein the first electrode layer and the second electrode layer are the same in material.

8. The semiconductor structure according to claim 1, wherein:

the material of the first electrode layer comprises one or more of aluminum, copper, titanium nitride, cobalt and tantalum nitride; and the material of the second electrode layer comprises one or more of aluminum, copper, titanium nitride, cobalt and tantalum nitride.

9. A method for forming a semiconductor structure, comprising:

providing a base;

forming a first electrode layer on the base, wherein the first electrode layer comprises a first comb handle part and a plurality of first comb tooth parts connected to the first comb handle part and arranged in parallel, where one end of the first comb handle part is configured to access an input signal, and the other end of the first comb handle part is configured to access an output signal;

forming a first via interconnect structure at a top of the first comb handle part, wherein the first via interconnect structure is electrically connected to the first comb handle part and comprises a first sub via interconnect structure and a second sub via interconnect structure located at two ends of the first comb handle part respectively; and forming a second electrode layer on the base, wherein the second electrode layer is located on the same layer with the first electrode layer and comprises a second comb handle part and a plurality of second comb tooth parts connected to the second comb handle part and arranged in parallel, where the second comb tooth parts and the first comb tooth parts are parallel in a crossed manner, and the second comb handle part is configured to be grounded.

10. The method for forming a semiconductor structure according to claim 9, wherein:

in the step of forming the first electrode layer, two sides of the first comb handle part are both provided with the plurality of first comb tooth parts connected therewith; and in the step of forming the second electrode layer, the second electrode layer is located on the two sides of the first comb handle part, and the second comb tooth parts on the second electrode layer on each side and the first comb tooth parts on the same side are parallel in the crossed manner.

11. The method for forming a semiconductor structure according to claim 9, wherein:

in the step of providing a base, a dielectric layer is formed on the base, and comprises a first dielectric layer and a second dielectric layer located at a top of the first dielectric layer, and the second dielectric layer and the first dielectric layer have etching selection ratio;

in the step of forming a first electrode layer on the base, the first electrode layer located on a top surface of the first dielectric layer is formed in the second dielectric layer; and in the step of forming a second electrode layer on the base, the second electrode layer located on the top surface of the first dielectric layer is formed in the second dielectric layer.

12. The method for forming a semiconductor structure according to claim 9, wherein in the step of providing a base, a dielectric layer is formed on the base; and the step of forming the first electrode layer and the second electrode layer comprises:

forming a first electrode groove and a second electrode groove in the dielectric layer, wherein the first electrode groove comprises a first comb handle groove and a plurality of first comb tooth grooves connected to the first comb handle groove and arranged in parallel, the second electrode groove comprises a second comb handle groove and a plurality of second comb tooth grooves connected to the second comb handle groove and arranged in parallel, and the second comb tooth grooves and the first comb tooth grooves are parallel in a crossed manner; and forming conductive materials in the first electrode groove and the second electrode groove, wherein the conductive materials located in the first electrode groove are used as a first electrode, comprising the first comb handle part located in the first comb handle groove and the first comb tooth parts located in the first comb tooth grooves, and the conductive materials located in the second electrode groove are used as a second electrode, comprising the second comb handle part located in the second comb handle groove and the second comb tooth parts located in the second comb tooth grooves.

13. The method for forming a semiconductor structure according to claim 12, wherein:

in the step of providing a base, a pattern transfer layer is further formed on a top of the dielectric layer, and in a direction parallel to a surface of the pattern transfer layer, the pattern transfer layer comprises a capacitance region; and the step of forming the first electrode groove and the second electrode groove comprises:

forming a plurality of first comb tooth mask openings located in the pattern transfer layer at intervals in parallel in the capacitance region;

forming a first comb handle mask opening penetrating through the capacitance region in the pattern transfer layer, wherein the first comb handle mask opening communicates with the plurality of first comb tooth mask openings;

forming a mask spacer layer on a side wall of the first comb handle mask opening and side walls of the first comb tooth mask openings;

after the mask spacer layer is formed, removing the remaining pattern transfer layer in the capacitance region so as to form a plurality of second comb tooth mask openings which are arranged at intervals in parallel and are parallel to the first comb tooth mask openings in a crossed manner and a second comb handle mask opening which is located in the side, away from the first comb handle mask opening, of the first comb tooth mask openings and communicates with the second comb tooth mask openings, wherein the second comb tooth mask openings and the second comb handle mask opening are spaced from the first comb tooth mask openings through the mask spacer layer; and with the mask spacer layer and the remaining pattern transfer layer as a mask, performing patterning treatment on the dielectric layer along the first comb handle mask opening, the first comb tooth mask openings, the second comb handle mask opening and the second comb tooth mask openings, and forming the first electrode groove and the second electrode groove in the dielectric layer.

14. The method for forming a semiconductor structure according to claim 13, wherein after the plurality of first comb tooth mask openings located in the pattern transfer layer at intervals in parallel are formed in the capacitance region, the first comb handle mask opening penetrating through the plurality of first comb tooth mask openings is formed in the pattern transfer layer.

15. The method for forming a semiconductor structure according to claim 13, wherein the material of the pattern transfer layer comprises amorphous silicon.

16. The method for forming a semiconductor structure according to claim 13, wherein:

before the plurality of first comb tooth mask openings located in the pattern transfer layer at intervals in parallel are formed in the capacitance region of the pattern transfer layer, the method further comprises: performing doping treatment on the pattern transfer layer of the capacitance region to make the pattern transfer layer in the capacitance region and the pattern transfer layer on an outer side of the capacitance region have etching selection ratio; and the step of removing the remaining pattern transfer layer in the capacitance region comprises: removing the remaining pattern transfer layer in the capacitance region by utilizing etching selection ratio between a sacrificial layer in the capacitance region and a sacrificial layer on the outer side of the capacitance region.

17. The method for forming a semiconductor structure according to claim 16, wherein the process for removing the remaining pattern transfer layer in the capacitance region comprises a wet etch process.

18. The method for forming a semiconductor structure according to claim 16, wherein the etching selection ratio between the pattern transfer layer in the capacitance region and the pattern transfer layer on the outer side of the capacitance region is greater than 120:1.

19. The method for forming a semiconductor structure according to claim 16, wherein ions for performing the doping treatment on the pattern transfer layer in the capacitance region comprise at least one of C, B or P.

20. The method for forming a semiconductor structure according to claim 9, wherein the first sub via interconnect structure is configured to access an input signal, and the second sub via interconnect structure is configured to access an output signal; and after the first electrode layer and the second electrode layer are formed, the method for forming a semiconductor structure further comprises: forming a second via interconnect structure at a top of the second comb handle part, wherein the second via interconnect structure is electrically connected to the second comb handle part and configured to be grounded.

* * * * *